US009159557B2

(12) United States Patent
Chang (10) Patent No.: US 9,159,557 B2
(45) Date of Patent: Oct. 13, 2015

(54) SYSTEMS AND METHODS FOR MITIGATING PRINT-OUT DEFECTS (71) Applicant: Taiwan Semiconductor Manufacturing Company, Ltd., Hsin-Chu (TW)

(72) Inventor: Shih-Ming Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/038,317

(22) Filed: Sep. 26, 2013

(65) Prior Publication Data

US 2015/0089458 A1    Mar. 26, 2015

(51) Int. Cl.
*G06F 17/50* (2006.01)
*H01L 21/02* (2006.01)
*G03F 1/36* (2012.01)
*H01L 27/02* (2006.01)
*H01L 21/027* (2006.01)

(52) U.S. Cl.
CPC .......... *H01L 21/027* (2013.01); *G06F 17/5081* (2013.01); *G03F 1/36* (2013.01); *G06F 17/5068* (2013.01); *H01L 27/0207* (2013.01)

(58) Field of Classification Search
CPC ........... G03F 1/144; G03F 1/36; G03F 7/705; G06F 17/5081; G06F 17/5068; H01L 27/0207
USPC ................................................ 716/50–53, 55
See application file for complete search history.

(56) References Cited

U.S. PATENT DOCUMENTS

| | | | | |
|---|---|---|---|---|
| 6,343,370 | B1 * | 1/2002 | Taoka et al. | 716/52 |
| 6,904,587 | B2 * | 6/2005 | Tsai et al. | 716/52 |
| 7,797,068 | B2 * | 9/2010 | Kyoh | 700/110 |
| 2001/0049811 | A1 * | 12/2001 | Taoka | 716/4 |
| 2010/0030545 | A1 * | 2/2010 | Uno et al. | 703/13 |
| 2012/0198393 | A1 * | 8/2012 | Taoka | 716/51 |
| 2013/0201461 | A1 | 8/2013 | Huang et al. | |

* cited by examiner

*Primary Examiner* — Stacy Whitmore
(74) *Attorney, Agent, or Firm* — Haynes and Boone, LLP (57) ABSTRACT The present disclosure provides methods and systems for mitigating print-out defects that result during semiconductor simulation and/or fabrication. One of the methods disclosed herein includes steps of receiving a first desired sub-layout and a second desired sub-layout and of optimizing the first desired sub-layout and the second desired sub-layout to generate a first optimized sub-layout and a second optimized sub-layout. The method further includes simulating the first optimized sub-layout and the second optimized sub-layout and of identifying one or more print-out defects in the simulated first optimized sub-layout and the simulated second optimized sub-layout. By comparing the simulated first optimized sub-layout and the simulated second optimized sub-layout it may be determined whether or not print-out defects in the simulated second optimized sub-layout are covered by the first desired sub-layout such that the first optimized sub-layout may be used to pattern material layers.

20 Claims, 6 Drawing Sheets

SYSTEMS AND METHODS FOR MITIGATING PRINT-OUT DEFECTS

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

BRIEF DESCRIPTION OF THE DRAWINGS

It is emphasized that, in accordance with the standard practice in the industry, various features are not drawn to scale. In fact, the dimensions of the various features may be arbitrarily increased or reduced for clarity of discussion.

Aspects of the figures in the present disclosure are best understood from the following detailed description when read in connection with the figures.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Further still, references to relative terms such as "front" and "back" are used to provide a relative relationship between elements and are not intended to imply any absolute direction. Various features may be arbitrarily drawn in different scales for simplicity and clarity.

In semiconductor device fabrication, the pursuit of smaller feature size has required a number of technological changes, including changes to photolithography systems and methods. As the critical dimension of a patterned layer on a given wafer decreases, many problems may emerge. For example, the geometry of the pattern may require compensation in order to be transferred more accurately, in order to approximate the desired shape more closely in the material layer being patterned. One type of such compensation, optical proximity correction (OPC) may complicate the control of patterning. Additionally, process parameters, such as energy and focus used in lithography processes becomes more difficult to control. Also, the occurrence of an irremovable mask defect, such as an opaque spot of a transparent mask used in deep-ultraviolet (DUV) lithography and immersion lithography or a phase defect in a reflective mask used in extreme-ultraviolet (EUV) lithography may degrade patterning fidelity. These factors may result in unwanted features being patterned into a given layer. This is sometimes referred to as a print-out defect. Thus, current patterning systems and methods have not been entirely satisfactory.

Figure 1A:
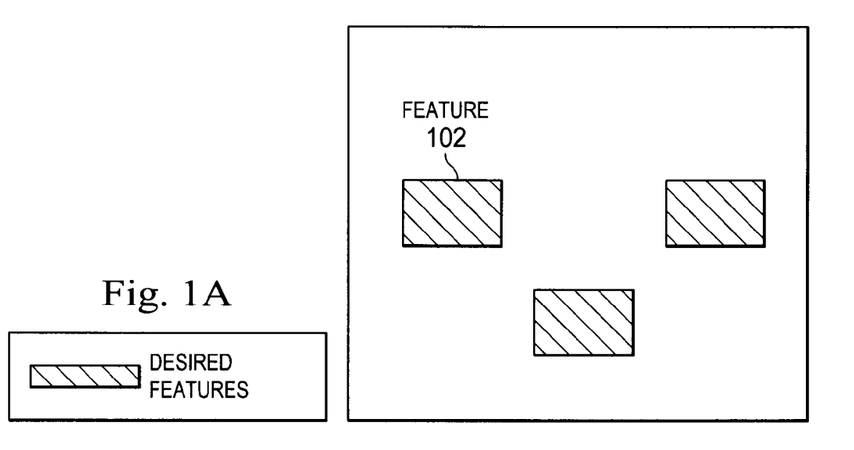
FIGS. 1A, 1B, and 1C are a sequence of diagrams illustrating how print-out defects may be discovered through a simulation process.
Figure 1B:
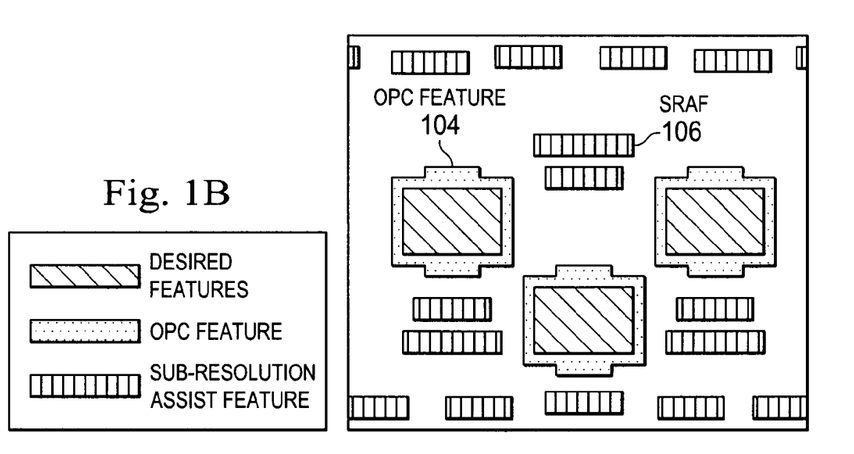
Figure 1C:
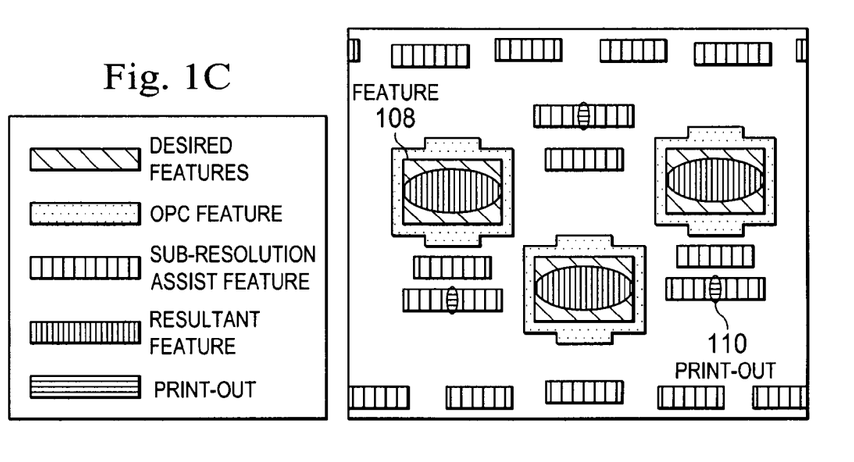

FIGS. 1A, 1B, and 1C are diagrammatic representations of a number of features of a desired layout as simulated by a simulation system. The simulation system may be provided by computer system, including one or more processors, memory in communication with the processor(s), and having input and output peripherals, such as a keyboard, a mouse, and a display. The simulation system may further include computer software including programmed instructions that when executed perform photolithographic and/or other semiconductor patterning simulations. The simulations may include optical simulations, chemical simulations, and other simulations.

As illustrated in FIG. 1A, a desired layout has been input into the simulation system. The desired layout includes a plurality of desired features 102. These features may be associated with the removal of material outside the geometry of the desired features 102 or with the removal of material inside the desired features 102. To clarify this disclosure, reference is generally made to the removal of material within the geometry of the desired features 102.

In FIG. 1B, the desired features 102 are each depicted as positioned within of an optical proximity correction (OPC) feature 104. The OPC feature 104 may be supplied by a designer or may be automatically generated by the simulation system according to predetermined parameters. In general, the OPC features 104 are designed to compensate for certain imaging errors, such as may be caused by diffraction or variations and defects within a given photolithography process. Such errors may occur more often as the critical dimension in the desired layout decreases. Thus, the OPC features 104 are intended to facilitate the faithful reproduction of the geometry of features 102. FIG. 1B also includes a number of sub-resolution assist features (SRAFs) 106 positioned around, but not contacting, the desired features 102 and the OPC features 104. Like the OPC features 104, the SRAFs 106 are included in the layout in order to improve the final result of the associated mask in a patterned material layer. The SRAFs 106 are intended to increase the accuracy of the resulting pattern, but are not intended to be printed in the underlying material layer as part of the resulting pattern.

FIG. 1C illustrates the simulated results of the layout depicted in FIG. 1B, which includes the desired features 102, the OPC features 104, and the SRAFs 106. As illustrated in FIG. 1C, the simulation depicts the resulting features 108, which differ somewhat from the desired features 102, but are largely similar. Ideally, the resulting features 108 and the desired features 102 would have identical geometries and positions. However, the simulation system indicates a noticeable degree of difference between these two. FIG. 1C also illustrates a number of print-out defects or, simply, print-outs 110. These print-out defects may include side-lobe printing, SRAF printing, full-size assist feature (FSAF) printing, and/ or other similar phenomena. The print-outs 110 may occur at or near the location of an SRAF 106 or may occur at other locations not associated with any feature of the layout of FIG. 1B. During typical simulation, layouts that result in print-outs must be modified in order to prevent such layouts. However, embodiments of the president disclosure may permit the use of a layout even if it results in print-outs, under certain circumstances.

Figure 2A:
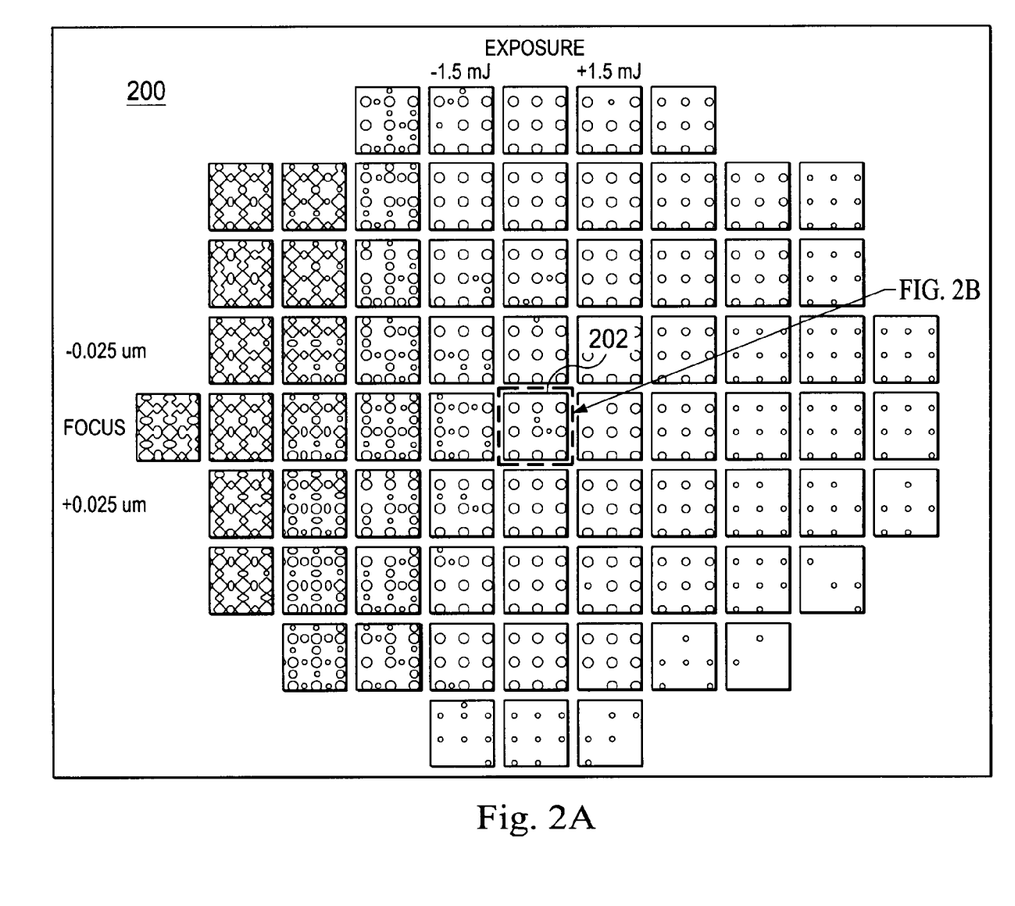
FIGS. 2A and 2B are a pair of exemplary images from a series of test wafers some of which include print-out defects.

FIG. 2A depicts a focus-energy metrics or focus-exposure metrics (FEM) table 200. The FEM table 200 includes images of a given test pattern as formed in a matrix of parameter permutations. The set of processing parameters present in FEM table 200 include an exposure energy parameter, arranged along an x-axis, and a focus parameter, arranged along a y-axis. FEM tables may be used to determine permissible and optimal process parameters, in terms desired results, such as critical dimension and the absence of print-out defects.

Figure 2B:
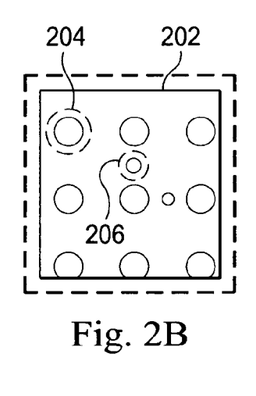

FIG. 2B provides a "close-up" view of the portion of test wafer 202 depicted in FIG. 2A. Thus, FIG. 2B provides additional visual detail regarding the test wafer 202. As can be seen in the close-up of test wafer 202, there are a number of features 204, which may be similar to the feature 102 of FIGS. 1A-C. The test wafer 202 also includes a number of print-outs 206. Typically, the FEM table 200 is used to determine the combinations of parameters that result in the best transfer of a desired layout into an underlying material layer and/or that define a range of parameter combinations over which satisfactory transfer is achieved. The embodiments of this disclosure may permit a larger range of parameter combinations to be used, because some combinations that result in print-out defects may be mitigated by subsequent patterning under certain conditions.

Figure 3:
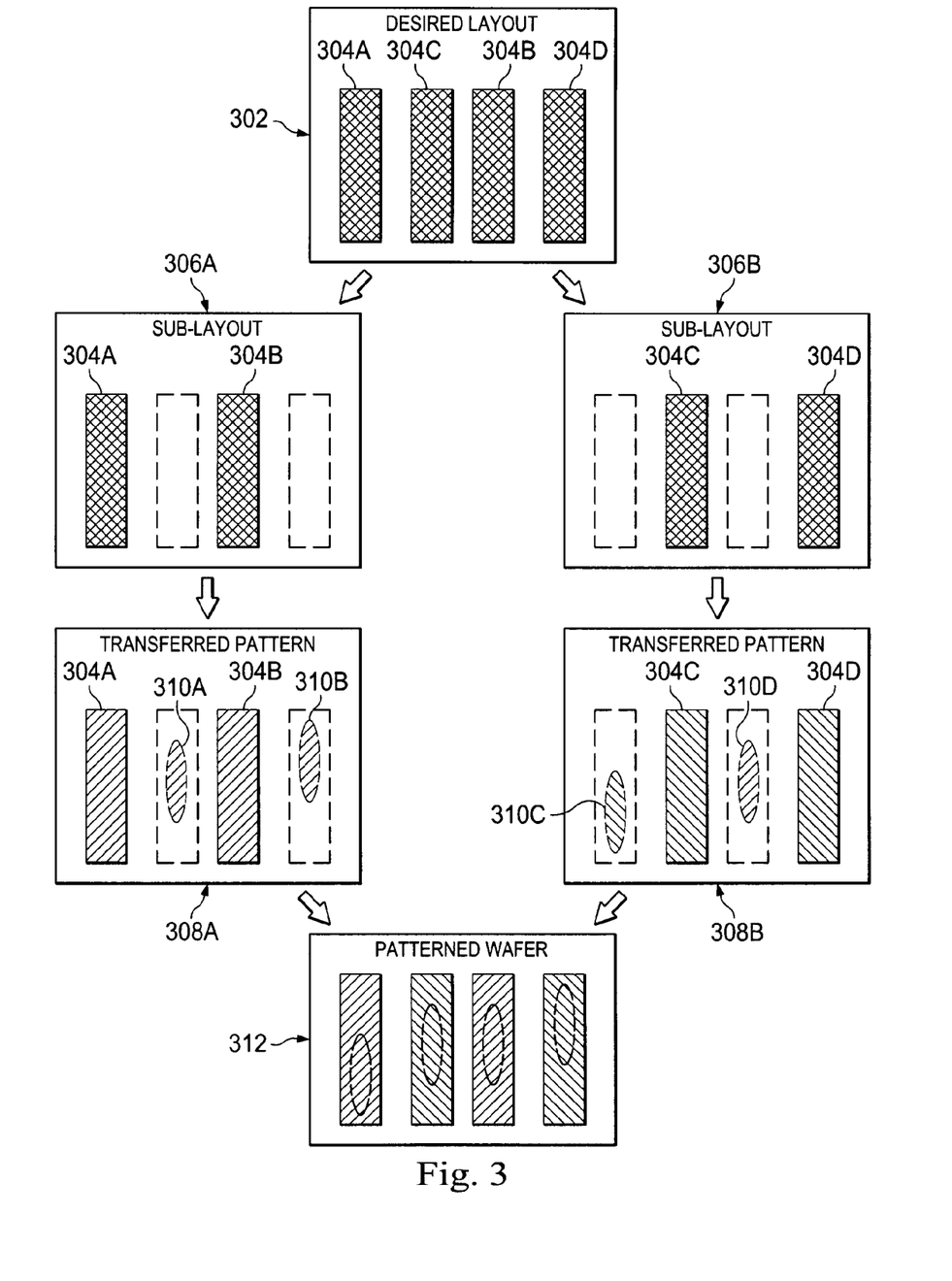
FIG. 3 is an illustration of a layout decomposition and recombination process according to some embodiments of the present disclosure.

FIG. 3 illustrates the decomposition of a single layout or mask into two sub-layouts or submasks and the use of those sub-layouts to pattern a material layer. FIG. 3 includes a desired layout 302. The desired layout 302 includes a number of individual, desired features 304A, 304B, 304C, and 304D. To form a semiconductor device, the desired features 304A-D have specified geometries to be realized in a material layer, which may be a photoresist layer in some embodiments and a metal mask layer in other embodiments. Given the geometries, dimensions, and separations distances of the desired features 304A-D, the desired layout 302 is decomposed into a number of sub-layouts. As depicted in FIG. 3, the desired layout 302 is decomposed into a sub-layout 306A and a sub-layout 306B. In some embodiments, the desired layout 302 may be decomposed into more than two sub-layouts. The sub-layouts 306A and 306B each include some of the features 304A-D. As illustrated, sub-layout 306A includes desired features 304A and 304B, while the sub-layout 306B includes desired features 304C and 304D.

When the features 304A and 304B are transferred to a first wafer, they form a transferred pattern 308A, as depicted. In some embodiments, sub-layouts 306A and 306B are negative masks, while in other embodiments they are positive masks. As depicted in FIG. 3, the transferred pattern 308A indicates that material within the geometries of the features 304A and 304B is removed. However, in addition to the removal of material from the areas defined by features 304A and 304B, the transfer of the sub-layout 306A into the material layer results in an exemplary print-out 310A and an exemplary print-out 310B. Similarly, the transfer of the sub-layout 306B results in exemplary print-outs 310C and 310D.

In the illustrations of sub-layouts 306A and 306B and in the transferred patterns 308A and 308B, the outline of the features removed from the desired layout 302 to form the respective sub-layout and transferred pattern is maintained in dashed lines. While both of the sub-layouts 306A and 306B result in print-out defects, neither of the sub-layouts 306A and 306B may require modification. This is because the print-out defects 310A and 310B of the transferred pattern 308A are "cross-covered", or fall within the geometries defined by, features 304C and 304D of sub-layout 306B. Similarly, because the print-out defects 310C and 310D of the transferred pattern 308B are covered by features 304A and 304B of sub-layout 306A. Thus, sub-layout 306A provides "cross-cover" for sub-layout 306B, and sub-layout 306B provides cross-cover for sub-layout 306B. In other words, when sub-layout 306A is used to pattern a material layer and sub-layout 306B is also used to pattern the material layer (this may be referred to as a two photolithography, two etch process, or 2P2E), the print-outs resulting from one sub-layout are removed by the subsequent patterning with the other sub-layout. Similarly, the print-outs that may be generated by one sub-layout may not be formed due to the earlier removal of material from the area of the print-out by the earlier transfer of the other sub-layout.

Figure 4:
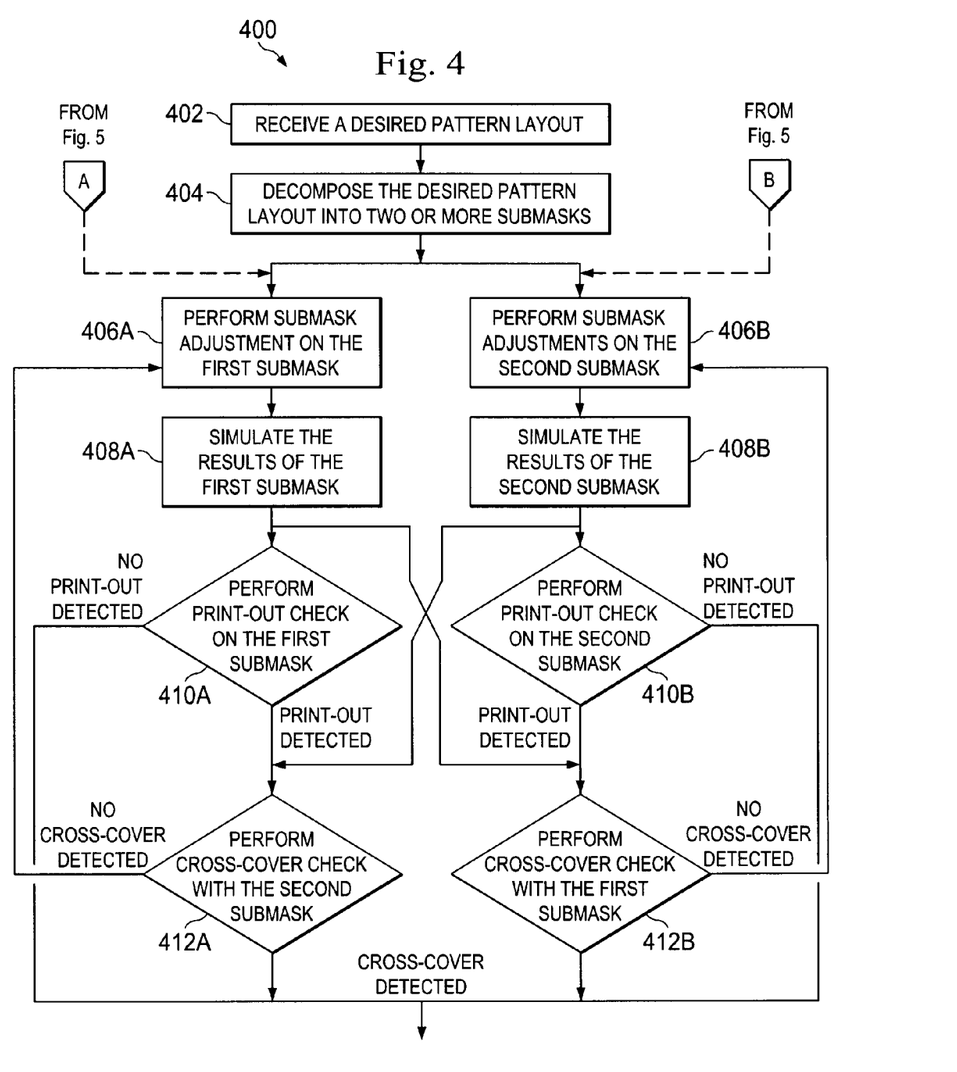
FIG. 4 is a flowchart of a method for mitigating print-out defects during simulation according to some embodiments of the present disclosure.

FIG. 4 is a flowchart of a method 400 for mitigating defects during a semiconductor fabrication process. Method 400 may be performed within the context of semiconductor fabrication simulation, such as may be performed during a design process of a semiconductor mask or of a processing step in a series of processing steps by which a semiconductor device is fabricated. As depicted in step 402, method 400 may begin when a desired pattern layout is received. The desired pattern layout may be similar to the desired pattern layout 302 of FIG. 3, in that it includes a number of features that designate the material that is to be removed from or retained in a material layer to be patterned. For example, the material layer may be a photoresist layer that is used in to pattern an underlying dielectric or conductive device layer.

In step 404, the desired pattern layout is decomposed into constituent parts, such as into two or more sub-layouts or submasks. An embodiment of step 404 may be seen in sub-layouts 306A and 306B, in which each of the decomposed sub-layouts includes some of the features included in the original desired layout. After the desired pattern layout is decomposed, each of the sub-layouts may be optimized and simulated.

In steps 406A and 406B, each of the sub-layouts is adjusted or optimized. The adjustments made to each of the sub-layouts may include the addition of optical proximity correction features, such as the OPC features 104 depicted in FIGS. 1B and 1C, and a number of assist features like full-scale assist features and/or the sub-resolution assist features, such as the SRAF features 106 of FIGS. 1B and 1C. The optimization results in optimized sub-layouts that may more closely approximate the desired layout in actual use. In some embodiments, additional information may be provided and used during the optimizations performed in step 406A and 406B. For example, step 406A may be performed using information received from a cross-cover check or comparison performed earlier in step 412A and/or from a cross-cover check performed in step 510A of FIG. 5. Both steps 412A and 510A will be discussed in greater detail below.

In steps 408A and 408B, the optimized sub-layouts are simulated to generate simulation results. This may be performed using a computerized simulation system that factors in the geometries of the optimized layouts, and mathematical/physical models of energy sources, focus, and the characteristics of relevant material layers, including the layers used in a semiconductor mask or reticle and the photoresist or other such layer undergoing photolithographic patterning. These simulated, optimized sub-layouts may be similar to the resultant features 108 and the print-outs 110 depicted in FIG. 1C. Thus, the simulation provides information regarding the geometry that is likely to be transferred to the mater layer undergoing patterning. As seen in FIG. 1C, the desired feature 102 differs in some respects from the simulated feature and/or the feature as realized in an actual semiconductor fabrication process. The simulation also provides information regarding where print-outs are likely to occur and their respective geometries. For example, FIG. 1C indicates print-outs 110 occurring at the location of some of the SRAF 106's. As another example, the print-outs 310A and 310B of FIG. 3 do not occur at the location of an SRAF or OPC feature, instead they occur within geometries defined within the other sub-layout.

In steps 410A and 410B, the result of the simulation of each optimized layout is subjected to a print-out check. During the print-out check, print-out defects, like print-outs 110 and 310A-D, are identified. This may be performed by comparing the geometries of the desired sub-layout layout with the simulated results. Where the simulation indicates material is removed that should remain and the material remains but should be removed, a print-out defect may be identified. When no print-outs are detected in step 410A or 410B, the respective sub-layout is considered acceptable for use in patterning material layers.

However, when a print-out defect is identified in step 410A, a cross-cover check is performed in step 412A. The cross-cover check 412A is a comparison of the identified print-outs of one simulated sub-layout with the geometries of the other sub-layout or simulated sub-layout. In some embodiments, the results of one entire simulated sub-layout are compared with the results of the other entire simulated sub-layout, rather than comparing the print-outs of one sub-layout with the other sub-layout. Referring to FIG. 3 as an example, the print-outs 310A and 310B may be compared with the transferred pattern 308B to determine whether or not the print-outs 310A and 310B are positioned within patterned features resulting from sub-layout 306B. Similarly, when a print-out defect is identified in step 410B, a cross-cover check is performed in step 412B. Referring again to FIG. 3 by way of example, the print-outs 310C and 310D may be compared with the transferred pattern 308A to determine whether or not the print-outs 310C and 310D are positioned within patterned features resulting from sub-layout 306A. In the example of FIG. 3, print-outs 310A and 310B pass the cross-cover check in step 412A, and print-outs 310C and 310D pass the cross-cover check in step 412B. In other words, although both sub-layouts resulting from the decomposition in step 404 resulted in print-out defects when simulated, both sub-layouts are considered acceptable and may be implemented as masks to pattern material layers.

While in some instances, print-out defects may pass the cross-cover checks in steps 412A and 412B, in other instances print-out defects resulting from one sub-layout are not mitigated by the transferred pattern from another sub-layout. In such instances in which identified print-outs are not "cross-covered", this related information may be used in a subsequent adjustment or optimization step 406A, in which OPC features, SRAFs, and/or FSAFs may be altered so as to eliminate the print-out defects or alter the print-outs such that after a subsequent simulation (a repeat of step 408A) and a subsequent print-out check (a repeat of step 410A), the print-outs may be cross-covered even if they have not been eliminated by the modified optimizations. A similar loop may result when print-outs identified in step 410B fail the cross-cover check of step 412B. In addition or as an alternative to the subsequent adjustment or optimization step, in the event that a cross-cover check fails, the method 400 may loop back to another decomposition process as occurs in step 404 or to the provision of another layout as in step 402.

In some embodiments of steps 412A and 412B, an offset distance may be incorporated into the cross-check comparison such that if an outer edge of a print-out of one sub-layout is less than the offset distance away from an edge of the covering feature of the other sub-layout, then comparison indicates that there is inadequate cross-cover and the sub-layout with the print-out is not considered acceptable. For example, an offset of about 5 nanometers may be used. In some embodiments of the method 400, the received desired pattern layout is a pair of sub-layouts that are intended to be transferred to two different material layers that are complementary.

Figure 5:
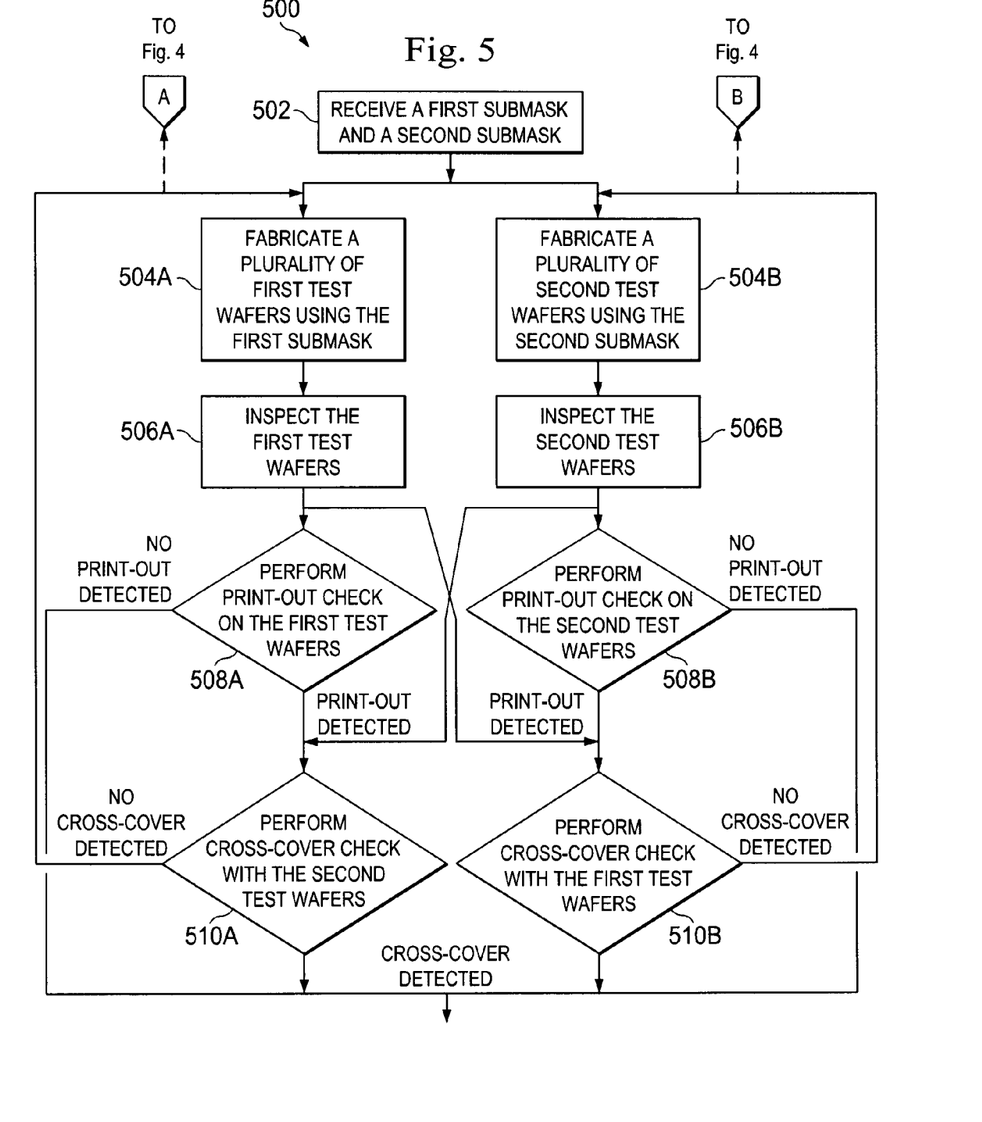
FIG. 5 is a flowchart of a method for mitigating print-out defects through process modification according to some embodiments of the present disclosure.

FIG. 5 is a flowchart of a method 500 of mitigating defects during a semiconductor fabrication process. Method 500 may begin in step 502 when a first submask and a second submask are received. The first and second submasks may be part of a single desired layout that has been decomposed and implemented into two submasks, such that the masks are to be used in sequential processing steps. Some embodiments may include more than two submasks. In FIG. 5, the first and second masks are used in sequential photolithography processing steps to pattern a single material layer. The first and second submasks may be the results of the decomposition performed in step 404 of method 400 as discussed above and illustrated in FIG. 4. Thus, the first and second submasks may have been optimized, simulated, and passed through a print-out check and a cross-cover check prior to reception in step 502.

After the first and second submasks are received, one or more test wafers are fabricated using the first submask (referred to herein as "first test wafers") in step 504A, and one or more test wafers are fabricated using the second submask (referred to herein as "second test wafers"). The test wafers made from both the first submask and the second submask may be fabricating using set of process parameters as discussed above in reference to the FEM table 200 of FIG. 2A. Thus, steps 504A and 504B may include fabricating a plurality of test wafers, each test wafer having a different pairing of exposure energy and proximity of focus.

In steps 506A and 506B, the first test wafers and the second test wafers are inspected. In some embodiments, the first and second test wafers may be visually inspected using an electronic microscope or another microscopy technique. In this way, the effects of the changing both of the parameters may be better understood and may provide indication as to optimal process settings and permissible ranges. Using the information obtained in the inspection of the first and second test wafers, print-outs like print-outs 206 may be identified on some or all of the first and second test wafers in steps 508A and 508B. If no print-outs are detected in a given wafer, that wafer and the process parameters used in its fabrication may to suitable for use in fabricating a desired semiconductor device.

In steps 510A and 510B, when print-outs are detected in a given wafer of the first test wafers, it is compared with a wafer of the second test wafers fabricated with the same processing parameters in order to determine whether the print-outs of the given wafer are formed within an area that is covered by the patterns formed on the wafer of the second test wafers such that it mitigates the print-outs. If the print-outs are formed by the first submask in a portion of a material layer that is subsequently removed when the second submask is used to pattern the material layer, the second submask may be considered to have mitigated the print-outs. Referring to FIG. 3 as an example, in step 510A a determination is made whether print-out 310A, which results from sub-layout 306A, is formed within a geometry that is to be subsequently removed by the application of the sub-layout 306B. Similarly, in an embodiment of 510B, a determination is made whether print-out 310C, which results from sub-layout 306B, is formed within a geometry that is to be removed earlier by the application of the sub-layout 306A.

When one of the first test wafers fails to pass the cross-cover check performed in 510A, information regarding the print-out may be used in a loop to select different process parameters during fabrication in a repeated step 504A, or may be used in an optimization or adjustment process as in step 406A of FIG. 4. Similarly, information obtained during step 510B may be used during steps 504B and 406B of FIG. 4.

Figure 6:
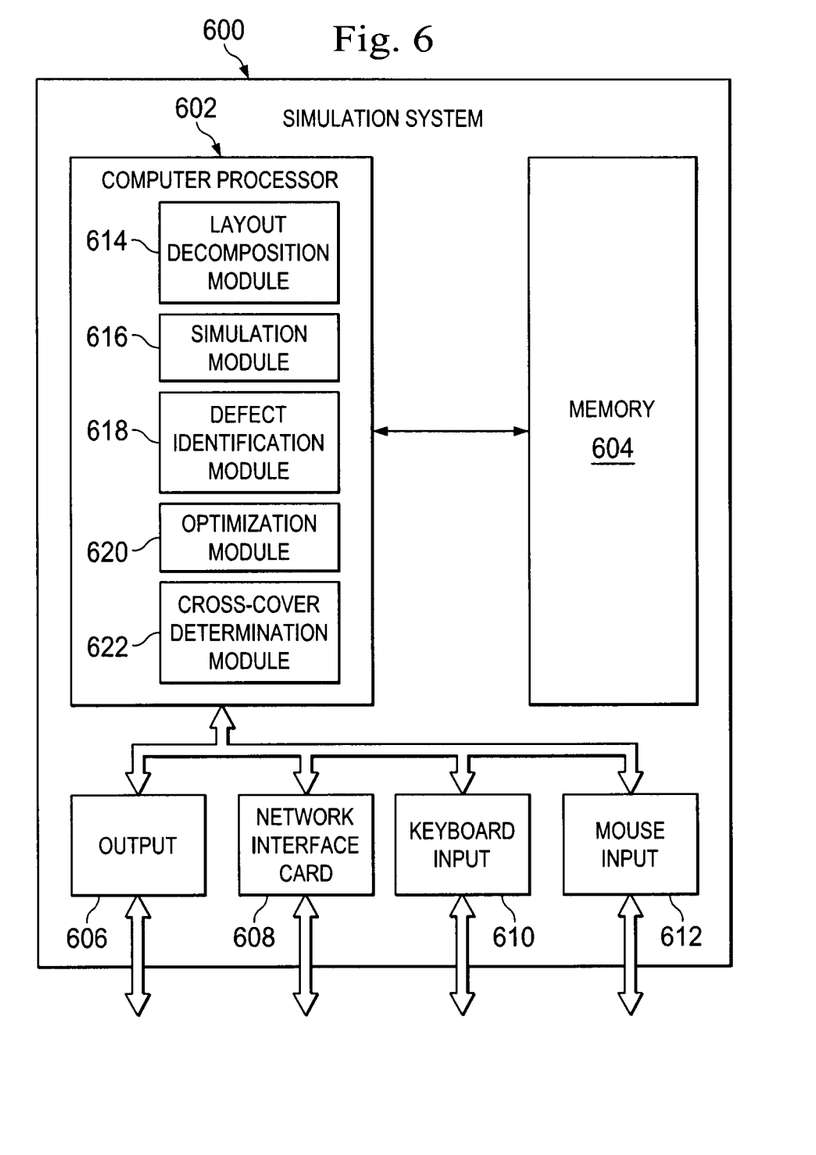
FIG. 6 is a diagram of a simulation system used in mitigating print-out defects.

FIG. 6 is an illustration of a simulation system 600 that may be used in performing one or more steps of methods 400 and 500 of FIGS. 5 and 6, respectively. The simulation system 600 may be similar in many respects to the system described through FIGS. 1A-C, and includes one or more computer processors or computing cores, collectively referred to as computer processor 602. The computer processor 602 is in communication with memory 604 such that it is configured to store information and retrieve information from memory 604. Memory 604 is a tangible, non-transient computer-readable medium, embodiments of which include without limitation RAM or ROM, and instructions stored on other devices (such as floppy disks, flash memory, or a CD ROM, for example). A plurality of input/output mechanisms is provided in the simulation system 600, include an output 606, which may communicate with a display to convey visual information to a user or operator. System 600 includes a network interface card 608 that allows the system 600 to communicate with remote computing and information storage systems. System 600 also includes a keyboard input 610 and a mouse input 612 that allow the operator to interact with the system to enter information and select options.

The computer processor 602 provides a plurality of modules that facilitate the simulation of semiconductor processes, include a layout decomposition module 614, a simulation module 616, a defect identification module 618, and a cross-cover determination module 620. Some embodiments of the simulation system 600 may include additional modules. The layout decomposition module 614 may receive a desired layout in a computer file, such as a layer in a GDSII file or a similar file, and place some of the features of the desired layout into a first sub-layout and some of the features of the desired layout into a second sub-layout. Some embodiments of the layout decomposition module 614 may produce more than two sub-layouts from a single desired layout.

The simulation module 616 may receive the sub-layouts from the layout decomposition module 614. Using information stored in memory, such as material property characteristics, the simulation module 616 may use physical modules to simulate the transfer of the patterns of the sub-layouts into one or more material layers, such as a photoresist layer or another layer used in semiconductor device fabrication. Simulation module 616 may indicate how a desired feature, such as feature 102 of FIGS. 1A-C, is likely to be transferred into a resulting feature, such as feature 108 of FIG. 1C. Additionally, simulation module 616 may indicate that one or more print-out features, like print-outs 110 of FIG. 1C and print-outs 310A-D of FIG. 3.

The simulations of the first and second sub-layouts may be provided to the defect identification module 620, which is configured to detect print-out defects, such as side-lobe defects and defects appearing at the site of an SRAF or a FSAF in sub-layouts that have been optimized. Embodiments of the simulation system 600 may include an optimization module 620 that is configured to perform optical proximity correction and/or add assist features to compensate for anomalies that may decrease the fidelity with which a pattern according to the desired layout is formed in a material layer. System 600 also includes a cross-cover determination module 622 that receives the simulated results of the sub-layouts decomposed from a single desired layout and compares them. The cross-cover determination module may compare the print-out defects resulting from one of the sub-layouts, and identified by the defect identification module 618, with the simulated results of the other sub-layout to determine whether those print-out defects are within the geometries of material that will be removed according to the other sub-layout. Such print-out defects may be allowed because their effects are mitigated by the subsequent lithographic process. The simulation system 600 may provide an indication to the operator that a sub-layout of submask is allowable through the output 604.

In some embodiments, the plurality of modules provided by processor 602 are provided as computer instructions, stored in memory 604, that when executed by the processor cause the computer system to provide the features of each module as described. Additionally, the methods 400 and 500 may be performed, at least in part, by a computer processor such as processor 602, executing instructions stored in memory.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

The present disclosure is directed generally to methods and systems for mitigating print-out defects that occur during photolithographic patterning. The present disclosure presents embodiments directed to facilitating the use of a mask that exhibits some print-out defects under certain conditions. Embodiments of the disclosure may increase the ability of a mask designer to create OPC features and assist features to optimize a desired layout. The variation of process parameters, the process window, may be larger as some print-outs may be allowed without persistent defects. Additionally, when a mask is undergoing fabrication, some defects in a given mask that previously would have caused the mask out of specification, may be mitigated, thereby increase the yield of mask making. Embodiments may be used in extreme ultraviolet (EUV) lithography to cover irreparable defects, such as a phase defect, to facilitate optical proximity correction and optimization, and to increase the yield of wafers and EUV masks. Embodiments of the invention may also be extended to E-Beam Direct Write (EBDW) lithography to facilitate e-beam proximity correction (EPC), to increase the yields on wafers and to improve data transferring.

In one embodiment, the present disclosure describes a method of mitigating defects during a semiconductor fabrication process. The method includes steps of receiving a first desired sub-layout and a second desired sub-layout and optimizing the first desired sub-layout and the second desired sub-layout to generate a first optimized sub-layout and a second optimized sub-layout. The method further includes steps of simulating the first optimized sub-layout and the second optimized sub-layout, of identifying one or more print-out defects in the simulated first optimized sub-layout and the simulated second optimized sub-layout, and of comparing the simulated first optimized sub-layout and the simulated second optimized sub-layout to determine whether print-out defects in the simulated second optimized sub-layout are covered by the first desired sub-layout.

In another embodiment, another method for mitigating defects formed during a semiconductor fabrication process is included. The method includes steps of fabricating a first wafer from a first submask and a second wafer from a second submask and of performing a visual inspection of the first wafer and the second wafer to identify print-out defects. The method also includes a step of determining whether a print-out defect on the first wafer is within an area covered by the second submask such that, after the use of the first submask and the second submask on a third wafer, the print-out defect is not present.

Additionally, the present disclosure includes a simulation system. As disclosed, an embodiment of the simulation system includes one or more processors in communication with a memory, the one or more processors providing a plurality modules. The modules of the simulation system include a desired layout decomposition module and a simulation module. The simulation module is configured to simulate a first resulting pattern and a second resulting pattern formed on a material layer based upon a decomposed layout. The modules also include a defect identification module that identifies print-out defects in the first resulting pattern and a cross-cover detection module that determined whether an identified print-out defect in the first resulting pattern is situated within a geometry of the second resulting pattern.

The present disclosure has been described relative to a limited number of embodiments. Improvements or modifications that become apparent to persons of ordinary skill in the art only after reading this disclosure are deemed within the spirit and scope of the application. Accordingly, it is appropriate that the appended claims be construed broadly and in a manner consistent with the scope of the invention.

What is claimed is:

1. A method for mitigating defects during a semiconductor fabrication process, the method comprising:
   receiving a first desired sub-layout and a second desired sub-layout;
   optimizing the first desired sub-layout and the second desired sub-layout to generate a first optimized sub-layout and a second optimized sub-layout;
   simulating the first optimized sub-layout and the second optimized sub-layout;
   identifying one or more print-out defects in the simulated first optimized sub-layout and the simulated second optimized sub-layout;
   comparing the simulated first optimized sub-layout and the simulated second optimized sub-layout to determine whether print-out defects in the simulated second optimized sub-layout fall within geometries defined by features in the first desired sub-layout;
   when the print-out defects in the simulated second optimized sub-layout fall within geometries defined by features in the first desired sub-layout, indicating that the second optimized sub-layout is allowable; and
   implementing the second optimized sub-layout as a mask for semiconductor fabrication.

2. The method of claim 1, further comprising:
   receiving a desired layout, the desired layout including a plurality of desired features having specified geometries to be realized in a material layer; and
   decomposing the desired layout into the first desired sub-layout and the second desired sub-layout; and
   wherein receiving the first sub-layout and the second sub-layout comprises receiving the first desired sub-layout and the second desired sub-layout.

3. The method of claim 1, further comprising:
   indicating that the simulated second optimized sub-layout is allowed when the print-out defects in the simulated second optimized layout fall within geometries defined by features in the first desired sub-layout; and
   indicating that the simulated second optimized sub-layout is not allowed when the print-out defects in the simulated second optimized layout do not fall within geometries defined by features in the first desired sub-layout.

4. The method of claim 1, wherein determining whether print-out defects in the simulated second optimized sub-layout fall within geometries defined by features in the first desired sub-layout comprises one of:
   determining whether the printout defects fall within geometries defined by features in the first optimized sub-layout; and
   determining whether the print-out defects are within an offset distance of an edge of a specified geometry of the first optimized sub-layout.

5. The method of claim 1, further comprising:
   comparing the simulated second optimized sub-layout and the simulated first optimized sub-layout to determine whether print-out defects in the simulated first optimized sub-layout fall within geometries defined by features in the second desired sub-layout.

6. The method of claim 1, wherein the print-out defects include at least one of:
   a side-lobe printing defect;
   an sub-resolution assist feature printing defect; and
   a full-size assist feature printing defect.

7. The method of claim 2, wherein the material layer is a metal layer.

8. The method of claim 1, wherein the first desired sub-layout is to be realized in a first material layer and the second desired sub-layout is to be realized in a second material layer, the first and second material layers being complementary layers.

9. A method for mitigating defects during a semiconductor fabrication process, the method comprising:
   receiving a first layout and a second layout;
   optimizing the first layout and the second layout to generate a third layout and a fourth layout;
   simulating the third layout and the fourth layout;
   identifying one or more print-out defects in the simulated third layout and the simulated fourth layout;
   comparing the simulated third layout and the simulated fourth layout to determine whether print-out defects in the simulated fourth layout fall within geometries defined by features in the first layout; and
   implementing the fourth layout as a mask for semiconductor fabrication.

10. The method of claim 9, further comprising:
    receiving a desired layout, the desired layout including a plurality of desired features having specified geometries to be realized in a material layer; and
    decomposing the desired layout into the first layout and the second layout.

11. The method of claim 9, further comprising:
    indicating that the simulated fourth layout is allowed when the print-out defects in the simulated fourth layout fall within geometries defined by features in the first layout; and indicating that the simulated fourth layout is not allowed when the print-out defects in the simulated fourth optimized layout do not fall within geometries defined by features in the first layout.

12. The method of claim 9, wherein determining whether print-out defects in the simulated fourth layout fall within geometries defined by features in the first layout comprises one of:
   determining whether the printout defects fall within geometries defined by features in the third layout; and
   determining whether the print-out defects are within an offset distance of an edge of a specified geometry of the third layout.

13. The method of claim 9, further comprising:
   comparing the simulated fourth layout and the simulated third layout to determine whether print-out defects in the simulated third layout fall within geometries defined by features in the second layout.

14. The method of claim 9, wherein the print-out defects include at least one of:
   a side-lobe printing defect;
   an sub-resolution assist feature printing defect; and
   a full-size assist feature printing defect.

15. The method of claim 10, wherein the material layer is a metal layer.

16. The method of claim 9, wherein the first layout is to be realized in a first material layer and the second layout is to be realized in a second material layer, the first and second material layers being complementary layers.

17. A method for mitigating defects during a semiconductor fabrication process, the method comprising:
   receiving a layout, the layout including a plurality of features having specified geometries to be realized in a material layer;
   decomposing the layout into the first sub-layout and the second sub-layout;
   optimizing the first sub-layout and the second sub-layout to generate a first optimized sub-layout and a second optimized sub-layout;
   simulating the first optimized sub-layout and the second optimized sub-layout;
   identifying one or more print-out defects in the simulated first optimized sub-layout and the simulated second optimized sub-layout;
   comparing the simulated first optimized sub-layout and the simulated second optimized sub-layout to determine whether print-out defects in the simulated second optimized sub-layout fall within geometries defined by features in the first sub-layout; and
   implementing the second optimized sub-layout as a mask for semiconductor fabrication.

18. The method of claim 17, further comprising:
   when the print-out defects in the simulated second optimized sub-layout fall within geometries defined by features in the first sub-layout, indicating that the second optimized sub-layout is allowable.

19. The method of claim 17, further comprising:
   indicating that the simulated second optimized sub-layout is allowed when the print-out defects in the simulated second optimized layout fall within geometries defined by features in the first sub-layout; and
   indicating that the simulated second optimized sub-layout is not allowed when the print-out defects in the simulated second optimized layout do not fall within geometries defined by features in the first sub-layout.

20. The method of claim 17, wherein determining whether print-out defects in the simulated second optimized sub-layout fall within geometries defined by features in the first sub-layout comprises one of:
   determining whether the printout defects fall within geometries defined by features in the first optimized sub-layout; and
   determining whether the print-out defects are within an offset distance of an edge of a specified geometry of the first optimized sub-layout.

\* \* \* \* \*